United States Patent [19]

Takatsu et al.

[11] Patent Number: 4,566,037
[45] Date of Patent: Jan. 21, 1986

[54] SOLID-STATE AREA IMAGING APPARATUS

[75] Inventors: Norihiko Takatsu; Atsushi Kawahara, both of Kawasaki; Masaki Isogai, Tokyo, all of Japan

[73] Assignee: Nippon Kogaku K.K., Tokyo, Japan

[21] Appl. No.: 451,599

[22] Filed: Dec. 20, 1982

[30] Foreign Application Priority Data

Dec. 25, 1982 [JP] Japan .................... 56-209105

[51] Int. Cl.$^4$ ............................. H01N 3/14
[52] U.S. Cl. ............................. 358/213; 357/24
[58] Field of Search ............ 358/213, 44, 212; 357/24 LR; 250/528

[56] References Cited

U.S. PATENT DOCUMENTS

| 4,081,841 | 3/1978 | Ochi et al. .................... 358/213 |
| 4,242,700 | 12/1980 | Weimer .................... 358/44 |
| 4,471,387 | 9/1984 | Nadler .................... 358/293 |

FOREIGN PATENT DOCUMENTS

| 2514156 | 10/1975 | Fed. Rep. of Germany ...... 358/213 |
| 0000928 | 1/1979 | Japan .................... 358/213 |

OTHER PUBLICATIONS

"A High Performance CCD Linear Imaging Array", A. A. Ibrahim et al., Oct. 1977, Agard Conference Proceedings No. 230.

Primary Examiner—Gene Z. Rubinson
Assistant Examiner—Robert G. Lev
Attorney, Agent, or Firm—Michael N. Meller

[57] ABSTRACT

There is disclosed a solid-state area imaging apparatus suitable for photographing a still picture. The apparatus comprises a plurality of vertical transfer electrodes and a pair of horizontal read CCDs, and the vertical transfer electrodes are vertically continuously arranged such that each electrode alternately crosses vertically adjoining two of a plurality of imaginary horizontal scanning lines thereby providing a plurality of photosensitive elements distributed in a checkered pattern on the imaging surface of the apparatus. This distribution of the photosensitive elements has the effect of applying the video signal to all the horizontal scanning lines. Thus, by using the existing integrated circuit technique, it is possible to realize a solid-state area imaging apparatus whose vertical resolution of reproduced still pictures is two times the vertical resolution obtained previously.

7 Claims, 8 Drawing Figures

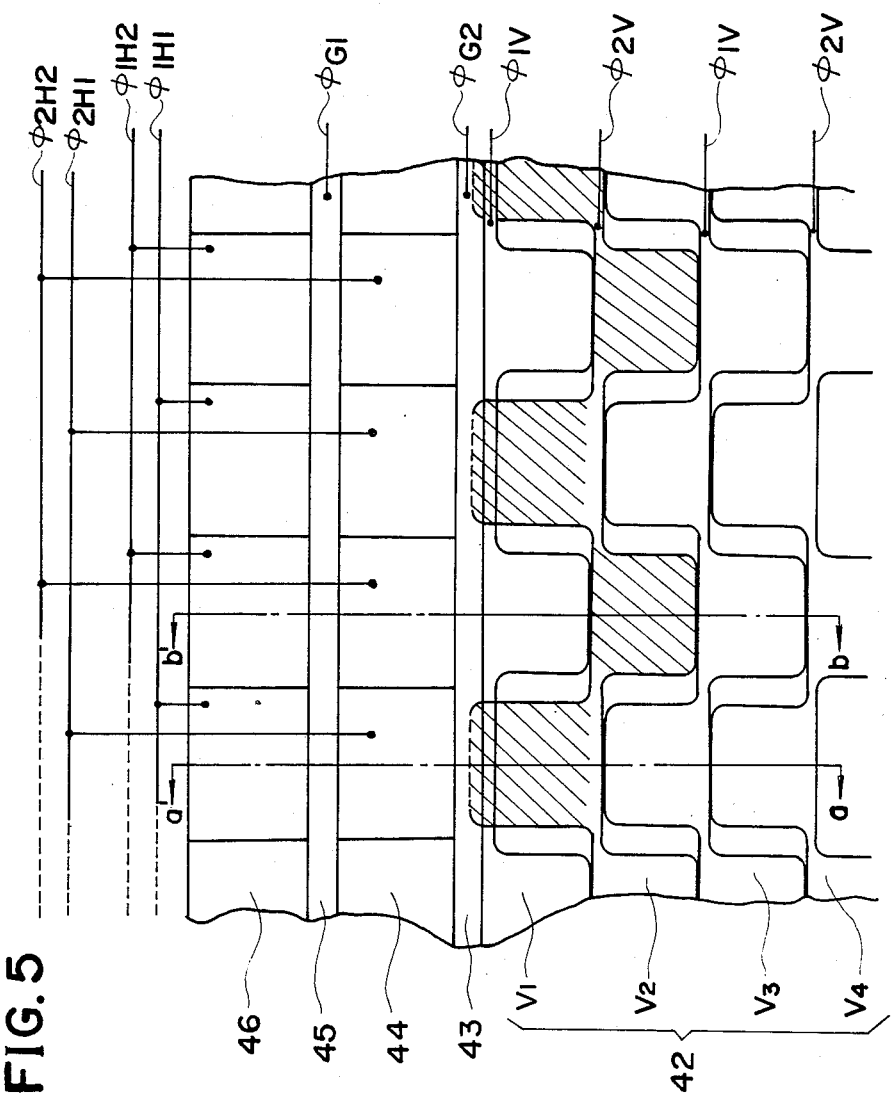

SOLID-STATE AREA IMAGING APPARATUS

BACKGROUND OF THE INVENTION

The present invention relates to solid-state area imaging apparatus and more particularly to a solid-state area imaging apparatus suitable for photographing still pictures.

The solid-state area imaging devices heretofore known in the art include for example FT-CCD (frame transfer-charge coupled device) and IL-CCD (interline transfer-charge coupled device).

With the FT-CCD, its photosensitive means also serves as vertical transfer means and its stored charges are transferred vertically by the vertical transfer means. To effect the vertical transfer, only alternate lines, i.e. either the odd horizontal scanning lines or the even horizontal scanning lines, can receive the light at a given time instant. Here, each of the odd and even horizontal lines indicates a straight line formed by connecting light signal charge storage positions and thus it is an imaginary line corresponding to the horizontal scanning line in an image pick up tube. Thus, in accordance with this invention the term horizontal scanning line means such a line.

Where this type of CCD is used as a video camera solid-state area imaging device, the use of the interlaced scanning determines a vertical resolution which is dependent on the number of vertical electrodes or the number of picture elements. However, where a still picture is reproduced on a television receiver by a still camera, there is the restriction of the same exposure time at the same time with the result that only one field comprised of either the odd horizontal scanning lines or the even horizontal scanning lines can be used as the light signal charges and consequently only the alternate lines can receive the light. Thus, the resulting resolution is one half that obtained by using all the scanning lines of the television picture. Even if the video signal of either one of the fields is reproduced by applying a pseudo interlaced scanning to the odd or even field, the resolution of the resulting still picture cannot attain the level obtained by using all the scanning lines.

On the other hand, the IL-CCD includes separate photosensitive means and vertical transfer means and thus the picture information can be applied simultaneously to all the photosensitive elements or all the picture elements. In this case, however, the light signal charges of the photosensitive elements are read out field by field by dividing the still picture into the odd fields by the odd horizontal scanning and the even fields by the even horizontal scanning. Thus, while there will be no problem if a mechanical shutter is used, if no mechanical shutter is used, during the time that the light signal charges of one of the two fields are transferred vertically (1/60 sec.), the photosensitive elements of the other field are exposed to the light with the resulting difference in picture information between the two fields. Thus, if the picture information is recorded and reproduced as such, a reproduced picture of good quality cannot be obtained and therefore only the video signal of one of the two fields can be used, giving rise to a problem from the standpoint of vertical resolution as in the case of FT-CCD mentioned previously.

SUMMARY OF THE INVENTION

The present invention has been made in view of the foregoing circumstances and it is the primary object of the invention to provide a solid-state area imaging apparatus in which the imaging surface of FT-CCD or IL-CCD includes photosensitive elements which are distributed and arranged in a checkered pattern so as to improve the vertical resolution of reproduced still pictures.

In accordance with the invention there is thus provided a solid-state area imaging apparatus comprising vertical transfer electrodes and horizontal read CCDs, in which the vertical transfer electrodes comprise a plurality of vertically continuously arranged electrodes each alternately vertically crossing two adjoining imaginary horizontal scanning lines, thereby distributing photosensitive elements in a checkered pattern on an imaging surface. By thus arranging the photosensitive elements in a checkered pattern on the imaging surface, the picture signal is applied to all the horizontal scanning lines and thus the existing integrated circuit techniques can ensure a vertical resolution which is two times that obtained previously. Also, with this checkered arrangement of the photosensitive elements, the horizontal resolution is scarcely deteriorated and performance satisfactory from the practical point of view is ensured, although there is a disadvantage that the phase of the photosensitive elements varies with every field and there is some tendency to cause folded distortion in the oblique direction.

In accordance with another preferred embodiment of the invention the horizontal read CCDs comprise an odd horizontal scanning read CCD to which are transferred the odd horizontal scanning light signal charges of the light signal charges at the photosensitive elements and an even horizontal scanning horizontal read CCD to which are transferred the even horizontal scanning light signal charges.

The use of the horizontal read CCDs arranged in two stages has the effect of simultaneously reading the video signal from the fields and thereby simplifying the subsequent processing of the video signal.

BRIEF DESCRIPTION OF THE DRAWINGS

FIG. 5 is a detailed partial view of the solid-state area imaging apparatus shown in FIG. 4.

DESCRIPTION OF THE PREFERRED EMBODIMENTS

Before describing a preferred embodiment of the present invention, the above-mentioned prior art devices will be described briefly with reference to the drawings to facilitate the better understanding of the invention.

Figure 1:
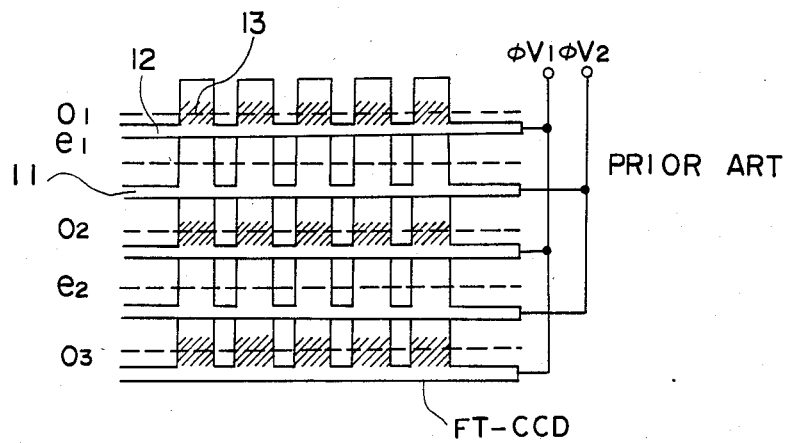
FIG. 1 is a diagram showing the arrangement of prior art FT-CCD electrodes.

In the FT-CCD shown in FIG. 1, the photosensitive means also serves as vertical transfer means and in the case of a two-phase excitation, vertical transfer electrodes 12 and 11 are respectively controlled by clock pulses $\phi V_1$ and $\phi V_2$ and their stored charges are transferred vertically. To effect this vertical transfer, only the alternate lines, i.e., either the odd horizontal scanning lines ($O_1$, $O_2$ . . . ) or the even horizontal scanning lines ($e_1$, $e_2$ . . . ), can receive the light at a given time. In the illustrated example, hatched portions 13 show the storage positions of the light signal charges in the condition where the clock pulse $\phi V_1$ is on and the clock pulse $\phi V_2$ is off.

Figure 2:
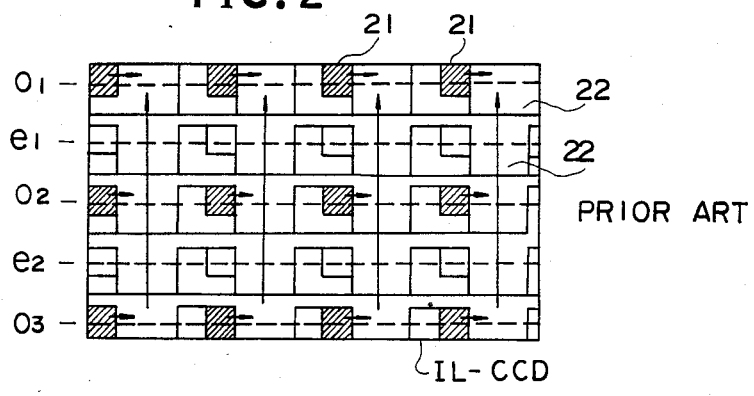
FIG. 2 is a diagram showing the arrangement of prior art IL-CCD electrodes.

In the IL-CCD shown in FIG. 2, photosensitive elements 21 and vertical transfer elements 22 are provided separately and therefore the picture information can be applied simultaneously to all the photosensitive elements 21 or all the picture elements. However, since the light signal charges at the photosensitive elements 21 are read out field by field, that is, the odd field by the odd horizontal scanning lines ($O_1$, $O_2$ . . . ) and the even field by the even horizontal scanning lines ($e_1$, $e_2$, . . . ) are read out alternately. Thus, where no mechanical shutter is used, it is possible to use only the video signal of either one of the fields due to the reasons mentioned previously.

As a result, in accordance with the prior art FT-CCD and IL-CCD, respectively, only the video signal of one of the fields can be used.

The deficiencies of the prior art devices have been made clear and the preferred embodiments of the invention will now be described.

Figure 3:
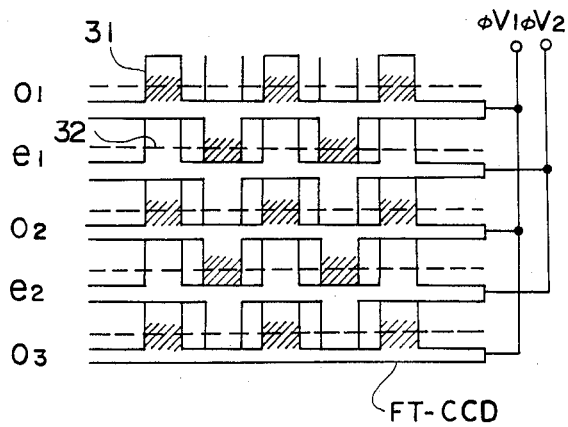
FIG. 3 is a diagram showing the arrangement of FT-CCD electrodes according to an embodiment of the invention.

FIG. 3 shows the arrangement of FT-CCD electrodes used in an embodiment of the invention in which vertical transfer electrodes 31 and 32 also serve as photosensitive elements and their portions intersecting horizontal scanning lines are distributed and arranged in a checkered pattern. Thus, it will be seen that either of the odd horizontal scanning lines ($O_1$, $O_2$, . . . ) and the even horizontal scanning lines ($e_1$, $e_2$, . . . ) are provided with the picture information in the vertical direction. Of course, in this case a mechanical shutter must be used.

Figure 4:
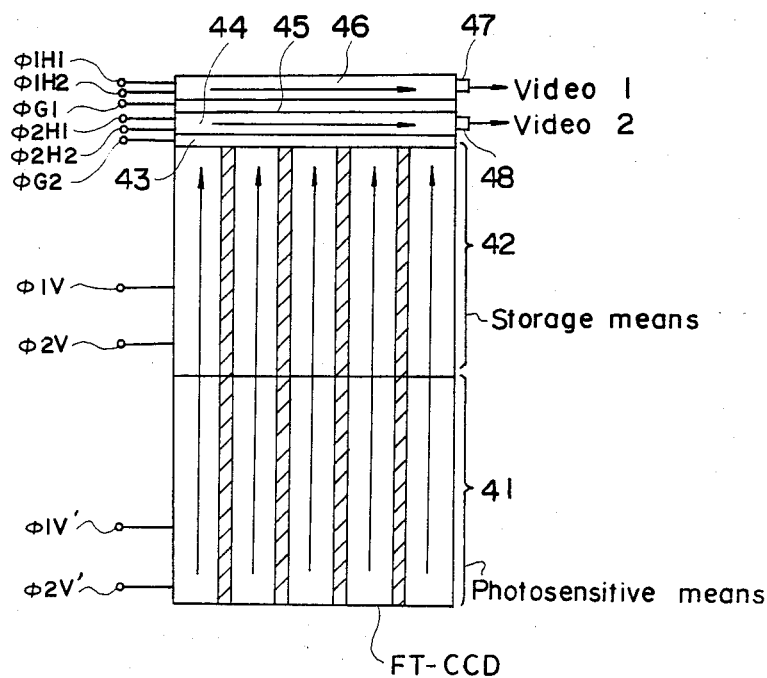
FIG. 4 is a diagram showing the construction of a solid-state area imaging apparatus according to the embodiment of the invention.

FIG. 4 is a diagram showing the construction of a solid-state area imaging apparatus according to the embodiment of the invention comprising photosensitive means 41 of the electrode structure shown in FIG. 3, storage means 42 and horizontal read CCDs 44 and 46 arranged in two stages. A gate electrode 43 is disposed between the storage means 42 and the horizontal read CCD 44 and a gate electrode 45 is disposed between the horizontal read CCDs 44 and 46.

The light signal charges distributed in a checkered pattern as shown in FIG. 3 are transferred during the horizontal blanking period in such a manner that the light signal charges of the odd horizontal scanning lines are transferred to the horizontal read CCD 46 through the storage means 42, the gate electrode 43, the horizontal read CCD 44 and the gate electrode 45. The light signal charges of the even horizontal scanning lines are transferred to the horizontal read CCD 44 through the storage means 42 and the gate electrode 43. In this case, the light signal charges of the odd horizontal scanning lines and the light signal charges of the even horizontal scanning lines are out of phase with each other in the horizontal direction, with the result that they do not conflict in the vertical direction and thus they can be easily transferred to the horizontal read CCDs 44 and 46, respectively. Note that the above-mentioned vertical transfer operations are effected by suitably applying clock pulses $\phi_1 V'$, $\phi_2 V'$, $\phi_1 V$, $\phi_2 V$, $\phi G_1$, $\phi G_2$, $\phi_1 H_2$, $\phi_1 H_1$, $\phi_2 H_1$ and $\phi_2 H_2$ to the corresponding electrodes.

Figure 6A:
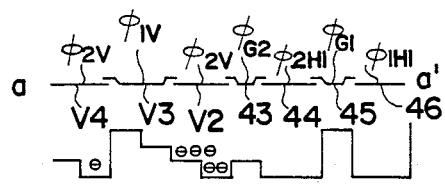
FIGS. 6A and 6B are respectively simplified sectional views taken along the lines a—a' and b—b' of FIG. 5 showing the potentials and the manner of transfer of the signal charges.
Figure 6B:
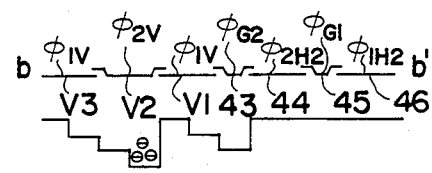

The above operation will now be described in greater detail with reference to FIGS. 5, 6A and 6B. FIG. 5 is a detailed partial view of a solid-state area imaging apparatus employing the FT-CCD of FIG. 4 and the same numerals used in FIG. 4 designate the equivalent component elements. Symbols $V_1$, $V_2$, $V_3$ and $V_4$ (in FIG. 5) designate the vertical transfer electrodes of the storage means 42 and these electrodes are of the same shape except the electrode $V_1$. FIGS. 6A and 6B are respectively schematic sectional views taken along the lines a—a' and b—b' of FIG. 5 and shown in (1) to (9) are the potentials and the positions of the signal charges at the sections a—a' and b—b'. The transfer of the signal charges $\ominus$ will now be described with reference to FIGS. 6A and 6B. The condition ① shows the potentials and the positions of the signal charges $\ominus$ in the condition shown in FIG. 5 and in this case the clock pulses are $\phi_1 V = $ off, $\phi_2 V = $ on, $\phi G_2 = $ on, $\phi_2 H_1 = $ on, $\phi G_1 = $ off, $\phi_1 H_1 = $ on, $\phi_2 H_2 = $ off and $\phi_1 H_2 = $ off. The condition ② changes the condition ① so that $\phi_1 V = $ on and $\phi_2 V = $ off and thus the signal charges $\ominus$ are transferred vertically to horizontal read CCD 44. In the condition ③, $\phi G_2 = $ off and $\phi G_1 = $ on so that in FIG. 6A the signal charges $\ominus$ are transferred to the horizontal read CCDs 44 and 46 and in FIG. 6B the charges are not transferred to the horizontal read CCDs as yet. The conditions ④ and ⑤ represent the operations for transferring the signal charges $\ominus$ at the horizontal CDD 44 and the gate electrode 45 of FIG. 6 to the horizontal read CCD 46 and this is accomplished by causing $\phi_2 H_1 = $ off and $\phi G_1 = $ off. Thus, no change occurs in the signal charges $\ominus$ of FIG. 6B. Then, the condition ⑥ causes $\phi_2 H_2 = $ on and the condition ⑦ causes $\phi_1 V = $ off and $\phi_2 V = $ on, thereby transferring vertically the signal charges $\ominus$ at the vertical transfer electrode $V_1$ of FIG. 6B. Then the condition ⑧ causes $\phi G_2 = $ off and the transfer to the horizontal read CCD 44 is completed. In this way, the signal charges $\ominus$ of FIG. 6A are transferred to the horizontal read CCD 46 and the signal charges $\ominus$ of FIG. 6B are transferred to the horizontal read CCD 44, thereby preventing the two signal charges from mixing together. With this potential condition being maintained, the clock pulses $\phi_1 H_1$ and $\phi_1 H_2$ and the clock pulses $\phi_2 H_1$ and $\phi_2 H_2$ are suitably activated to effect the horizontal reading. The condition ⑨ causes $\phi G_2 = $ on, $\phi_2 H_1 = $ on and $\phi_2 H_2 = $ off and then the condition ① is restored. The above-mentioned operation is repeated so that the signal of the odd field is generated from the horizontal read CCD 46 and the signal of the even field is generated from the horizontal read CCD 44.

The signal charges of the odd horizontal scanning lines and the signal charges of the even horizontal scanning lines are read simultaneously from output terminals 47 and 48 of the horizontal read CCDs 44 and 46, respectively.

The pair of output signals read from the output terminals 47 and 48, respectively, may be recorded simultaneously by a dual channel magnetic head on the corresponding tracks of a recording medium, e.g., a magnetic disk, and the recorded signals may be easily read to a television receiver in an interlaced manner by repeating the operation of reading the odd field signal and the operation of reading the even field signal alternately for reproducing purposes. In addition, the application of the video signal to each of the horizontal scanning lines results in a vertical resolution which is two times that obtained previously.

Figure 7:
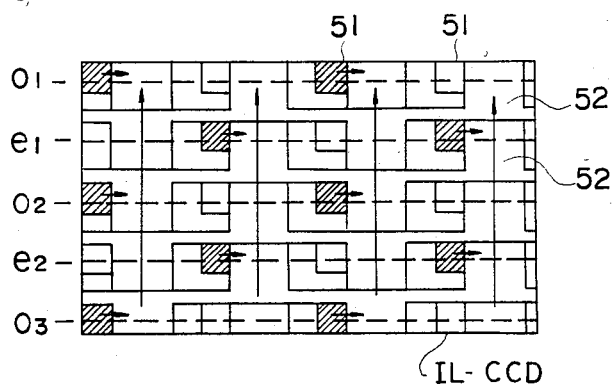
FIG. 7 is a diagram showing the arrangement of IC-CCD electrodes according to another embodiment of the invention.

FIG. 7 shows the electrode structure of an IL-CCD according to another embodiment of the invention. Differing from the FT-CCD, photosensitive means 51 and vertical transfer means 52 are provided separately and the photosensitive means 51 (the hatched portions in the Figure) are distributed and arranged in a checkered pattern. To read the light signal charges of the photosensitive means 51, it is only necessary to use the same electrode structure as that of FIG. 3 for the electrode structure of the vertical transfer means 52.

In this case, the light signal charges of the respective horizontal scanning lines ($O_1, O_2 \ldots$) and ($e_1, e_2, \ldots$) are transferred to two horizontal read CCDs (not shown) and are subjected to the similar signal processing as in the case of the first embodiment.

While the above-described embodiments are each adapted for the two-phase excitation, basically the required construction for the four-phase excitation is of course the same.

What is claimed is:

1. A solid-state area imaging apparatus for producing a still picture signal, said apparatus being provided on an electronic still camera, comprising:
    (a) photosensitive means including a plurality of photoelectric conversion elements for storing electric charges in accordance with the intensity of light impinging thereupon, said plurality of photoelectric conversion elements being so arranged as to form a plurality of parallel lines on a predetermined area in a predetermined direction and being divided into a first group and a second group, such that the photoelectric conversion elements of said first group are arranged apart from one another in a checkered pattern with one or more photoelectric conversion elements of said second group being disposed therebetween;
    (b) first transfer means for transferring a first plurality of electric charges in a direction substantially perpendicular to said predetermined direction, said first plurality of electric charges being previously stored in said first group of photoelectric conversion elements; and
    (c) second transfer means for transferring a second plurality of electric charges in said direction substantially perpendicular to said predetermined direction, said second plurality of electric charges being previously stored in said second group of photoelectric conversion elements wherein said first transfer means extend linearly in said predetermined direction and comprise a plurality of electrodes, each of said electrodes having a plurality of projections extending therefrom at regular intervals, said projections extending alternatingly in a first direction substantially perpendicular to said predetermined direction and in a second direction opposite to said first direction.

2. An apparatus according to claim 1, wherein said plurality of projections of each electrode are arranged such that each projection contacts a corresponding one of said plurality of photoelectric conversion elements which store said first plurality of electric charges.

3. An apparatus according to claim 1, wherein when either of said first and second transfer means transfers electric charges, the other of said first and second transfer means stops transferring electric charges.

4. An apparatus according to claim 1, wherein said first group of photoelectric conversion elements comprises:
    a first subgroup of photoelectric conversion elements disposed at odd numbered positions along a first line; and
    a second subgroup of photoelectric conversion elements disposed at even numbered positions along a second line,
    wherein said numbered positions are determined by counting the number of regular intervals from a reference line lying perpendicular to said predetermined direction.

5. An apparatus according to claim 1, wherein said apparatus further comprises:
    a first charge coupled device for reading out electric charges in said predetermined direction, said electric charges being those transferred by said first or second transfer means from said photoelectric conversion elements arranged in the odd numbered lines of said plurality of lines which are counted out in the direction substantially perpendicular to said predetermined direction; and
    a second charge coupled device for reading out electric charges in said predetermined direction, said electric charges being those transferred by said first or second transfer means from said photoelectric conversion elements arranged in the even numbered lines of said plurality of lines which are counted out in the direction substantially perpendicular to said predetermined direction.

6. A solid-state area imaging apparatus for producing a still picture signal, said apparatus being provided on an electronic still camera, comprising:
    (a) photosensitive means including a plurality of photoelectric conversion elements for storing electric charges in accordance with the intensity of light impinging thereupon, said plurality of photoelectric conversion elements being so arranged as to form a plurality of parallel lines on a predetermined area in a predetermined direction and being divided into a first group and a second group, such that the photoelectric conversion elements of said first group are arranged apart from one another in a checkered pattern with one or more photoelectric conversion elements of said second group being disposed therebetween;
    (b) first transfer means for transferring a first plurality of electric charges in a direction substantially perpendicular to said predetermined direction, said first plurality of electric charges being previously stored in said first group of photoelectric conversion elements; and
    (c) second transfer means for transferring a second plurality of electric charges in said direction substantially perpendicular to said predetermined direction, said second plurality of electric charges being previously stored in said second group of photoelectric conversion elements, wherein said second transfer means extend linearly in said predetermined direction and comprise a plurality of electrodes, each of said electrodes having a plurality of projections extending therefrom at regular intervals, said projections extending alternatingly in a first direction substantially perpendicular to said predetermined direction and in a second direction opposite to said first direction.

7. An apparatus according to claim 6, wherein said plurality of projections of each electrode are arranged such that each projection contacts a corresponding one of said plurality of photoelectric conversion elements which store said second plurality of electric charges.

* * * * *